United States Patent
Rajeev Kumar et al.

(10) Patent No.: US 12,287,370 B2
(45) Date of Patent: *Apr. 29, 2025

(54) DATA GATING USING SCAN ENABLE PIN

(71) Applicant: APPLE INC., Cupertino, CA (US)

(72) Inventors: FNU Rajeev Kumar, Santa Clara, CA (US); Chandan Shantharaj, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/169,894

(22) Filed: Feb. 16, 2023

(65) Prior Publication Data

US 2023/0194606 A1   Jun. 22, 2023

Related U.S. Application Data

(63) Continuation of application No. 17/882,657, filed on Aug. 8, 2022, now Pat. No. 11,609,270, which is a
(Continued)

(51) Int. Cl.
*G01R 31/3185* (2006.01)
*G01R 31/3177* (2006.01)

(52) U.S. Cl.
CPC . *G01R 31/318536* (2013.01); *G01R 31/3177* (2013.01); *G01R 31/318541* (2013.01);
(Continued)

(58) Field of Classification Search
CPC ........ G01R 31/318536; G01R 31/3177; G01R 31/318541; G01R 31/318552; G01R 31/318572
(Continued)

(56) References Cited

U.S. PATENT DOCUMENTS 5,920,575 A * 7/1999 Gregor ........... G01R 31/318541
714/726
7,222,276 B2 * 5/2007 Kashiwagi ..... G01R 31/318552
714/726
(Continued)

FOREIGN PATENT DOCUMENTS

KR       20040001334 A    1/2004
WO       2004051294 A1    6/2004
(Continued)

OTHER PUBLICATIONS

KR Application # 1020247007441 Office Action dated Apr. 24, 2024.
(Continued)

*Primary Examiner* — John J Tabone, Jr.

(57) ABSTRACT

An Integrated Circuit (IC) includes a storage element and control circuitry. The control circuitry is configured to select, responsively to a scan-enable control, between a functional-data input and a scan-data input to serve as an input to the storage element, to selectively disable toggling of an output of the storage element, responsively to a clock-enable control, by gating a clock signal provided to the storage element, and, while the clock-enable control indicates that the output of the storage element is to be disabled from toggling, to select the input of the storage element to be the scan-data input.

16 Claims, 4 Drawing Sheets

Related U.S. Application Data continuation of application No. 17/363,093, filed on Jun. 30, 2021, now Pat. No. 11,454,671.

(52) U.S. Cl.
CPC .............. *G01R 31/318552* (2013.01); *G01R 31/318572* (2013.01)

(58) Field of Classification Search
USPC ............... 714/726, 727, 729, 731, 724, 744
See application file for complete search history.

(56) References Cited

U.S. PATENT DOCUMENTS

| | | | | |
|---|---|---|---|---|
| 7,457,998 | B1* | 11/2008 | Bhatia | G01R 31/318541 714/724 |
| 7,843,218 | B1* | 11/2010 | Ramaraju | G01R 31/318541 326/46 |
| 9,291,674 | B1 | 3/2016 | Lu et al. | |
| 9,568,551 | B1* | 2/2017 | Kataria | G01R 31/31727 |
| 10,110,234 | B1* | 10/2018 | Durairajan | G01R 31/318552 |
| 2008/0016417 | A1* | 1/2008 | Sinha | G11C 29/48 714/726 |
| 2008/0278205 | A1* | 11/2008 | Zhang | G01R 31/31727 327/158 |
| 2008/0307280 | A1 | 12/2008 | Putman et al. | |
| 2011/0289372 | A1 | 11/2011 | Tang et al. | |
| 2012/0001669 | A1* | 1/2012 | Salling | H03K 19/0013 327/218 |
| 2013/0254609 | A1* | 9/2013 | Yonetoku | G01R 31/31858 714/729 |
| 2014/0082421 | A1 | 3/2014 | Marinissen et al. | |
| 2016/0179074 | A1* | 6/2016 | Kim | H03K 3/356 326/46 |
| 2017/0097389 | A1 | 4/2017 | Maliuk et al. | |
| 2018/0203067 | A1* | 7/2018 | Chen | G11C 29/46 |
| 2019/0089354 | A1* | 3/2019 | Venugopal | H03K 19/0016 |
| 2019/0154757 | A1* | 5/2019 | Lujan | G01R 31/318541 |

FOREIGN PATENT DOCUMENTS

| | | |
|---|---|---|
| WO | 2007149808 A2 | 12/2007 |
| WO | 2014043856 A1 | 3/2014 |

OTHER PUBLICATIONS

DE Application # 112022001867.4 Office Action dated May 28, 2024.

CN Application # 202280038300.1 Office Action dated Jun. 15, 2024.

* cited by examiner

DATA GATING USING SCAN ENABLE PIN

CROSS-REFERENCE TO RELATED APPLICATION

This application is a continuation of U.S. patent application Ser. No. 17/882,657, filed Aug. 8, 2022, which is a continuation of U.S. patent application Ser. No. 17/363,093, filed Jun. 30, 2021. The disclosures of these related applications are incorporated herein by reference.

FIELD OF THE DISCLOSURE

The present disclosure relates generally to integrated circuits, and specifically to power reduction of gated-clock circuits in an integrated circuit.

BACKGROUND OF THE DISCLOSURE

To ease the testing challenge of integrated circuits (ICs) that include millions of transistors, a Scan Mode is often implemented, wherein flip-flops of the IC are daisy-chained, allowing a simple scan-chain testing of otherwise complex state machines. For a summary of scan testing techniques see, for example, "Enhancing Testability of Large-Scale Integrated Circuits via Test Points and Additional Logic, IEEE Transactions on Computers, C-22 (1), 46-60; M. Williams J. and Angell (doi: 10.1109/t-c.1973.223600).

To reduce the dynamic power consumption of multi-million-transistor ICs, clock gating is often used. In "Clock Gating-A Power Optimization Technique for VLSI Circuits (J. Shinde et. al., 2011 Annual IEEE India Conference, Dec. 16-18, 2011; DOI 10.1109/INDCON.2011.6139440) the authors investigate the various clock gating techniques that can be used to optimize power in VLSI circuits at RTL level, and discuss various issues involved while applying this power optimization techniques at RTL level.

SUMMARY OF THE DISCLOSURE

An embodiment that is described herein provides an Integrated Circuit (IC) including a storage element and control circuitry. The control circuitry is configured to select, responsively to a scan-enable control, between a functional-data input and a scan-data input to serve as an input to the storage element, to selectively disable toggling of an output of the storage element, responsively to a clock-enable control, by gating a clock signal provided to the storage element, and, while the clock-enable control indicates that the output of the storage element is to be disabled from toggling, to select the input of the storage element to be the scan-data input.

In some embodiments, the storage element includes one or more latches, and, in selecting the scan-data input, the control circuitry is configured to prevent any of the latches from toggling while the output is disabled from toggling, regardless of whether or not the functional-data input is toggling. In an example embodiment, the control circuitry is configured to prevent the latches from toggling without adding latency to the functional-data input.

In a disclosed embodiment, by selecting the scan-data input while the clock-enable control indicates that the output is to be disabled from toggling, the control circuitry is configured to set the input to the storage element to a constant logic state, regardless of whether or not the functional-data input is toggling. In another embodiment, the control circuitry includes a logic gate, which is configured to set the storage element to a scan mode in response to the clock-enable control disabling the clock signal.

In yet another embodiment, the control circuitry includes a logic gate, which is configured to set the input to the storage element to a constant logic state in response to the clock-enable control disabling the clock signal. In still another embodiment, the storage element includes a latch that is clocked by an inverse of the clock signal, and, in selecting the scan-data input while the clock-enable control indicates that the output is to be disabled from toggling, the control circuitry is configured to set an input of the latch to a constant logic state.

There is additionally provided, in accordance with an embodiment that is described herein, a method in an Integrated Circuit (IC) that includes at least a storage element. The method includes selecting, responsively to a scan-enable control, between a functional-data input and a scan-data input to serve as an input to the storage element. Responsively to a clock-enable control, toggling of an output of the storage element is selectively disabled by gating a clock signal provided to the storage element. While the clock-enable control indicates that the output of the storage element is to be disabled from toggling, the input of the storage element is selected to be the scan-data input.

There is also provided, in accordance with an embodiment that is described herein, an apparatus including a processor that includes (i) fetch circuitry configured to fetch instructions and (ii) execute circuitry configured to execute instructions. One or both of the fetch circuitry and the execute circuitry include a storage element and control circuitry. The control circuitry is configured to select, responsively to a scan-enable control, between a functional-data input and a scan-data input to serve as an input to the storage element, to selectively disable toggling of an output of the storage element, responsively to a clock-enable control, by gating a clock signal provided to the storage element, and, while the clock-enable control indicates that the output of the storage element is to be disabled from toggling, to select the input of the storage element to be the scan-data input.

The present disclosure will be more fully understood from the following detailed description of the embodiments thereof, taken together with the drawings in which:

DETAILED DESCRIPTION OF EMBODIMENTS

Overview

Figure 1:
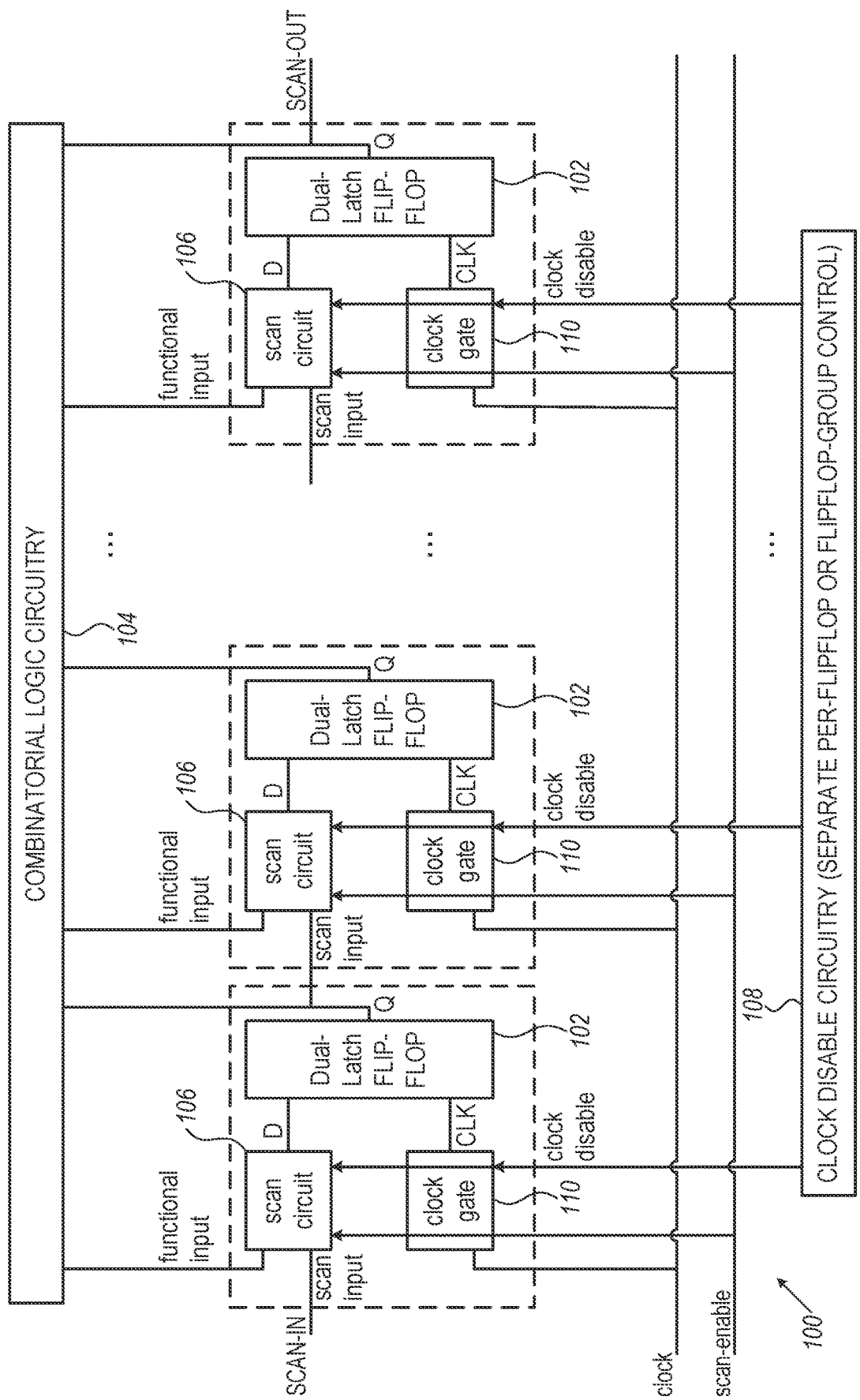
FIG. 1 is a block diagram that schematically illustrates the structure of an integrated circuit (IC), in accordance with an embodiment that is described herein.

Typically, complex integrated circuits include storage elements, each configured to store a "logic-1" or a "logic-0" value. In the present context, the term "storage element" refers to elements such as flipflops, latches and the like. The embodiments described herein refer to flipflops, by way of example, but the disclosed techniques are applicable to other suitable types of storage element.

A plurality of flipflop types exists, including, for example, clocked and non-clocked flipflops, R-S flipflops, J-K flipflops, T-flipflops and others. A common type of flipflop, which is widely used in today's integrated circuits, is a D-flipflop (sometimes referred to as DFF), which includes a D-input, a clock-input, and an output. The DFF is configured to store the logic value asserted at its D-input when the clock-input transitions, e.g., from logic-low to logic-high. In the disclosure below, we will sometimes refer to flipflops and DFFs interchangeably, by way of example.

To allow easy testing of digital integrated circuits, scan circuitry may be added to a group of DFFs in the integrated circuit. An external tester may indicate a Scan-mode (or scan-enable) to the scan circuitry, wherein DFFs of the group should be scanned. The scan circuitry is configured, responsively to the scan-mode indication, to sequentially interconnect (e.g., "daisy chain") the DFFs in the group, so that a scan-input, external to the group of DFF, propagates between the DFFs of the group, from a first DFF to a last DFF, and from the last DFF to a scan-out output of the group of DFFs. (We will refer hereinbelow to two modes of integrated circuits operation—the scan-mode, described hereinabove, and a functional mode, wherein the scan circuitry is inoperative, and the DFFs receive functional rather than scan inputs.)

We will further refer hereinbelow to logic-low and logic-high as low and high, respectively; we will refer to a transition from low to high as a rising edge (or "posedge") and to a transition from high to low as falling edge (or "negedge"). As would be appreciated, low and high do not necessarily represent voltage levels; for example, low and high may refer, in some logic families, to current directions; moreover, in some logic families low represents voltage that is higher than the voltage level represented by high (e.g., in negative logic).

A DFF typically includes a primary latch, and a secondary latch. In a posedge-triggered DFF, the primary latch propagates the D-input of the DFF to an input of the secondary latch when the clock input is low, and latches the value of the D-input upon a clock rising edge; the secondary latch propagate the output of the primary latch to the DFF output when the clock input is high, and latches the value of the primary latch upon a clock falling edge. conversely, in a negedge-triggered DFF, the primary latch propagates the input when the clock is high and latches upon a clock negedge, whereas the secondary latch propagates the output of the primary when the clock is low and latches the output upon a clock rising edge. (It is noted that the primary and secondary latches may operate in a manner that is also referred to as "master" (i.e., primary) and "slave" (i.e., secondary) by those of skill in the art. While the primary/secondary terminology is used herein, it is expressly intended that "primary" and "secondary" be interpreted to encompass these counterpart terms.)

High-speed high-density integrated circuits may include millions of DFFs, and the toggling of the clock inputs of the DFFs is a significant contributor to power consumption of the integrated circuit. A common technique to reduce the power consumption is clock gating, wherein the clock signal is disabled in portions of the circuit that are not used. Clock gating saves power by pruning the clock tree, at the cost of adding more logic to a circuit.

Typically, when the clock of a DFF is disabled, the clock input of the DFF is set to a logic level wherein the primary latch is transparent (that is, it propagates the D input to the secondary latch), but does not latch the logic value, whereas the secondary latch stores the last value that the primary latch output upon the clock falling edge (e.g., the clock is set low for posedge triggered DFFs). Thus, as the secondary latch does not toggle, power dissipation is significantly reduced. (The secondary latch typically drives logic circuitry, and, when toggling, charges and discharges additional nodes, resulting in significant power dissipation.)

However, when the primary latch is transparent, it typically does toggle when the D input toggles, even though the clock of the DFF may be disabled and the changes on the D input are not visible at the output of the secondary latch. Thus, even though the clock of a DFF is disabled, primary latch toggling may still result in significant power consumption.

Embodiments that are described herein provide for apparatuses and methods wherein data gating is used in addition to clock gating of the clock disabled DFFs, to further reduce the power consumption of clock disabled DFFs. In some embodiments, control circuitry is configured to, responsively to a clock-disable input, direct the scan-enable input, which is constant when scan is not indicated, to the input of the corresponding DFF, setting the DFF input to a constant logic level. Thus, when the clock is disabled, both the data input and the clock input are gated, which may result in substantial reduction of the integrated circuit power consumption.

Moreover, the disclosed control circuitry does not add any logic in the functional data path, e.g., before the functional input of the flipflop. As such, the disclosed techniques do not incur additional latency and do not degrade the achievable data throughput or clock speed.

SYSTEM DESCRIPTION

FIG. 1 is a block diagram that schematically illustrates the structure of an integrated circuit (IC) 100, in accordance with an embodiment that is described herein. IC 100 may include any suitable type of IC that is configured to carry out any suitable function, e.g., a microprocessor, a video processor or any other. The IC includes a group of Dual-Latch D-type flipflops (DFFs) 102, which share a common clock input (designated "clock"), and combinatorial logic circuitry 104, which is configured to generate functional inputs to the DFFs 102, responsively to the stored data in the DFFs (and, possibly, responsively to other inputs). Each DFF includes a clock input ("CLK"), a D input and a Q output (in embodiments, DFF 102 may include other inputs, e.g., Reset).

As would be appreciated, integrated circuits according to some embodiments may include multiple clock inputs and multiple groups of DFFs, the DFFs of each group sharing one of the multiple clock inputs. In some embodiments, IC 100 may include other logic, such as non-clocked flipflops, memories, analog circuits, and others. For the sake of clarity, however, we will refer hereinbelow to an embodiment wherein IC 100 includes a single clock, and we will ignore circuitry which is not related to the group of DFFs, such as memories, analog subsystems, and the like.

According to the example embodiment illustrated in FIG. 1, IC 100 includes scan circuits 106, each scan circuit coupled to a respective DFF 102 and configurable to transfer to the D input of the DFF either a functional input (output from combinatorial logic circuitry 104) or a scan input, responsively to a scan-enable input.

DFFs 102 are coupled to each other in a daisy-chain manner, such that the scan input of the scan circuit that is coupled to a first DFF is coupled to a SCAN-IN input of IC 100, the scan input of the scan circuit that is coupled to a second DFF is coupled to the Q output of the first DFF, and so on. The Q output of a last DFF is coupled to a SCAN-OUT output of the IC. (In some embodiments the SCAN-IN and/or the SCAN-OUT are not inputs/outputs of IC 100; instead, the scan-in may be input from and/or the SCAN-OUT may be output to a built-in-self-test (BIST) circuitry in IC 100.)

IC 100 further includes Clock Disable circuitry 108, which is configured to disable the clock inputs of DFFs 102 that may be inactive. A Clock-gate circuit 110 is coupled to each DFF 102; the clock gate circuit is configured to disable the clock input of the DFF responsive to a clock-disable control that clock-disable circuitry 108 outputs, for example, by applying a constant logic-low to the clock input of the DFF. As explained above, this will prevent the secondary latch of DFF 102 from toggling and thus reduce power consumption.

Figure 2:
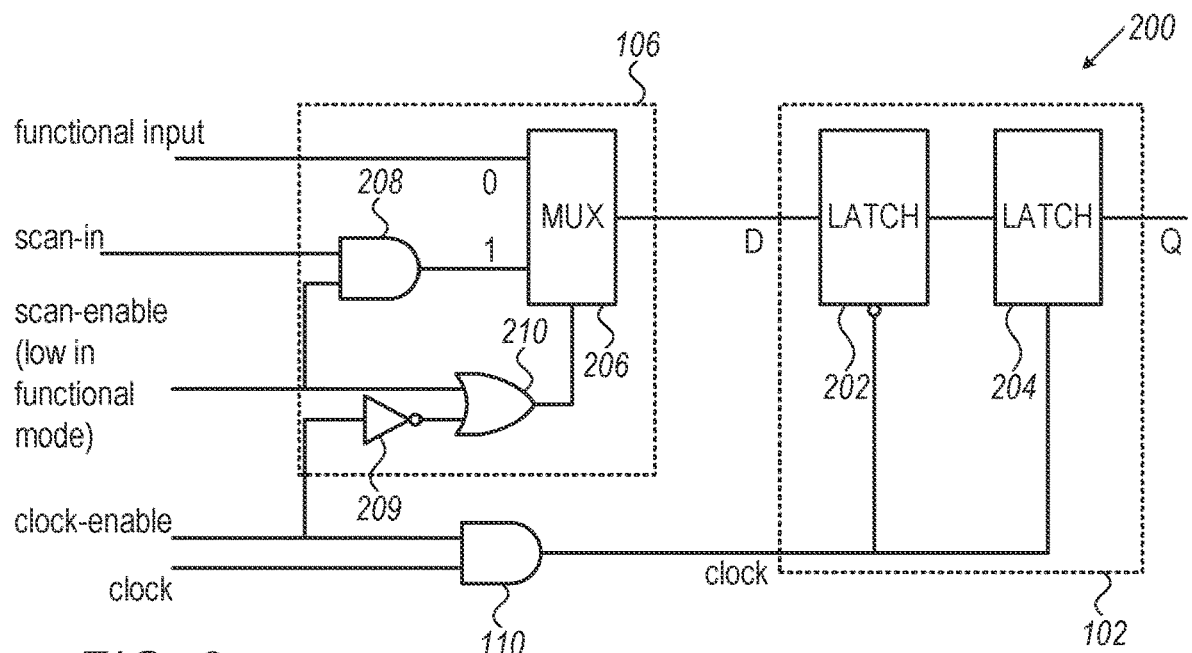
FIG. 2 is a block diagram that schematically illustrates the structure of a D-type flipflop (DFF) that is coupled to a scan circuit and a clock-gate, in accordance with an embodiment that is described herein.

According to the example embodiment illustrated in FIG. 1, data gating in addition to clock gating is employed, to prevent the primary latch (in addition to the secondary latch) from toggling. (An exemplary internal structure of dual-latch flipflop 102, showing the primary and secondary latches, is depicted in FIG. 2 below.) Scan circuit 106 is configured to, responsively to the clock disable input, send a constant logic level (e.g., low) to the D-input of the corresponding DFF. As a result, the primary latch will not toggle, and additional power reduction will be achieved (In embodiments, responsively to the clock disable input, the scan circuit sends the scan-enable input, which is constant-low in functional mode, to the D-input of the DFF).

As would be appreciated, the structure of IC 100 illustrated in FIG. 1 and described hereinabove is an example embodiment cited for the sake of clarity. Other structures may be used in alternative embodiments. For example, the scan circuits may also be used to set the DFFs to a known state; other type of flipflops may be used; and, more than one scan chain may be implemented in the IC.

In the present context, scan circuit 106 and clock gating circuit 110 are referred to jointly as "control circuitry" that carries out the disclosed technique, although in other embodiments control circuitry to implement the disclosed technique may be implemented using different circuits or a different organization than that of FIG. 1. In the present context, the terms "clock enable input" and clock disable input" are used interchangeably to refer to a signal that controls whether the clock is enabled or disabled.

FIG. 2 is a block diagram that schematically illustrates the structure of a DFF 102 that is coupled to a scan circuit 106 and a clock-gate 110, in accordance with an embodiment that is described herein. DFF 102, scan circuit 106 and clock gate 110, which were discussed with reference to FIG. 1, are described herein with more detail, according to the example embodiment illustrated in FIG. 2. As is noted below, FIG. 2 illustrates the logical function of embodiments of scan circuit 106 and clock-gate 110 in terms of AND and OR gates for ease of presentation. It is noted, however, that any suitable circuit structure may be employed to implement the illustrated functionality.

DFF 102 includes two latches-a primary latch 202 and a secondary latch 204. The primary latch propagates the D-input of the DFF to the input of the secondary latch when the clock input is low and latches the value of the D-input upon a clock rising edge. The secondary latch propagates the output of the primary latch to the DFF output when the clock input is high and latches the value of the primary latch upon a clock falling edge.

The clock input of DFF 102, which is shared by primary latch 202 and secondary latch 204, is generated by clock-gate 110. According to the example embodiment illustrated in FIG. 2, clock-gate 110 is an AND gate, propagating the clock input to the DFF clock input when a clock-enable input is high, and setting the clock input of the DFF low when the clock-enable is low, preventing the secondary latch from toggling.

Scan Circuit 106 includes a multiplexor 206, which is configured to select a source for the D input of DFF 102, an AND gate 208, which is configured to gate the scan data, an Inverter 209 and an OR gate 210, which is configured to indicate to which source multiplexor 206 should send to the D input of DFF 102.

In Scan-Mode, the scan-enable input is high, AND gate 208 outputs the scan-in data, OR gate 210 outputs logic-high, causing multiplexer 206 to transfer the output of AND gate 208 to the D input of DFF 102. Thus, a scan-path is configured, and the scan-input propagates through DFF 102 Q output (and, thence, to the scan input of the scan circuit of the next DFF-stage, as illustrated in FIG. 1). In Functional-Mode, the scan-enable input is low, and, if the clock-enable input is high, multiplexor 206 transfers the functional input to the D input of DFF 102.

However, in functional mode, if the clock enable is low, OR gate 210 indicates that multiplexor 206 should transfer the output of AND gate 208 to the D input of DFF 102. As the scan-enable input is now low, Inverter 209 outputs a high and AND gate 208 will output low, the D input of DFF 102 will be low, and, hence, primary latch 202 will not toggle, regardless of any toggling in the functional input, resulting in further reduction of the power consumption.

As would be appreciated, the structure of DFF 102, scan circuit 106 and clock-gate 110, illustrated in FIG. 2 and described above, are cited by way of example. In alternative embodiments, various suitable structures may be used. For example, De-Morgan equivalents of the illustrated gates may be used. In some embodiments, the scan-enable and/or the clock-enable inputs may be active-low. In embodiments, other types of DFF may be used, and in some embodiments some or all the DFFs may be replaced by other types of flipflops, e.g., T-flipflop.

In the present example, the various elements of FIG. 2 other than flipflop 102 (scan circuit 106 and clock-gate 110) serve as the control circuitry that carries out the disclosed technique. In alternative embodiments, the control circuitry may have any other suitable configuration.

Figure 3:
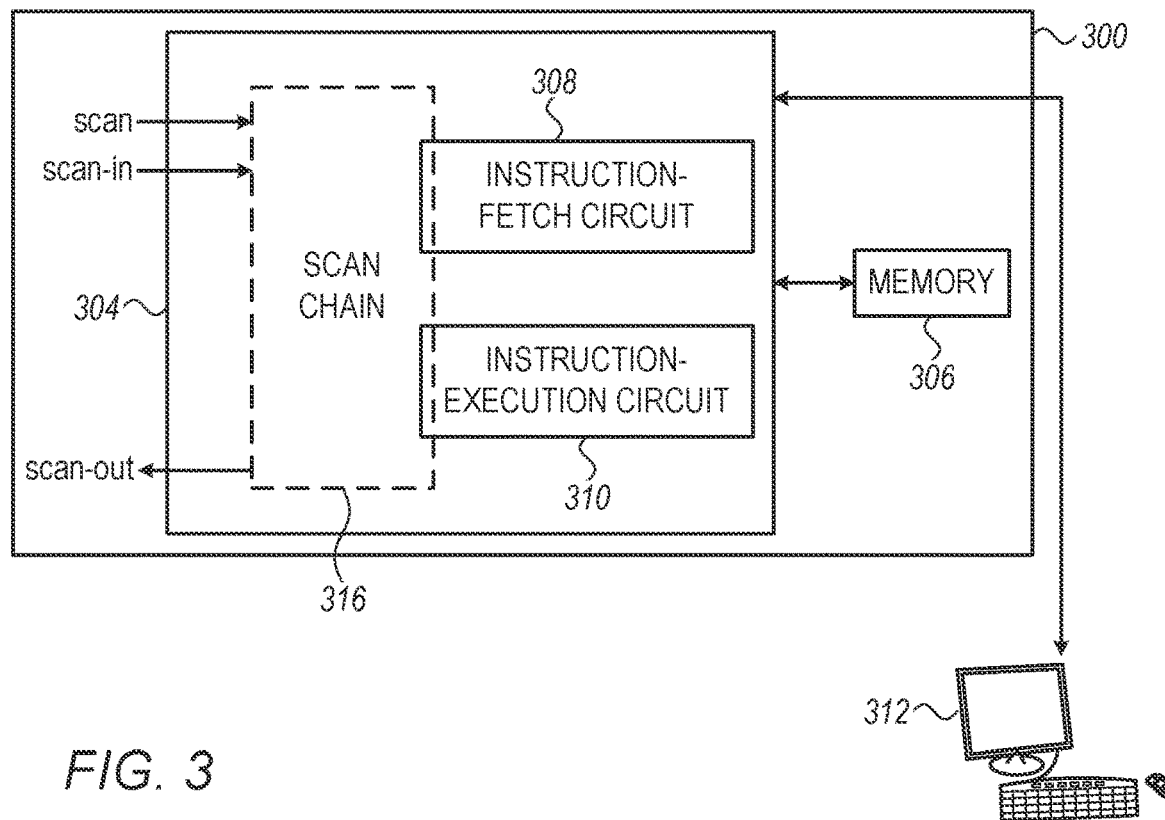
FIG. 3 is a block diagram that schematically illustrates the structure of a computer, in accordance with an embodiment that is described herein.

FIG. 3 is a block diagram that schematically illustrates the structure of a computer 300, in accordance with an embodiment that is described herein. Computer 300 includes a Central Processing Unit (CPU) 304 and a memory 306. The CPU includes an Instruction Fetch Circuit 308, which is configured to fetch and decode instructions (e.g., from memory 306) and an Instruction Execution Circuit 310, which is configured to execute the decoded instructions. A user may interface with computer 300 through a display device and one or more input devices, in the present example a Display/Keyboard/Mouse subsystem 312. As would be appreciated, computer 300 may include a plurality of CPUs, as well as numerous other components, including, for example, encryption/decryption units, graphic processors, Network-Interface circuits, analog circuits, and wireless interface units.

Instruction Fetch Circuit 308 and Instruction Execution Circuit 310 include multiple flipflops, such as, for example, flipflops 102 of FIGS. 1 and 2. According to the example embodiment illustrated in FIG. 3, CPU 304 includes a Scan Chain 316, which covers at least some of the flipflops in Instruction Fetch Circuit 308 and in Instruction Execution Circuit 310 (and/or additional logic circuits that CPU 304 may include). The scan chain includes scan circuits (e.g., Scan Circuit 106, FIG. 2), which are configured to operate the respective flipflops in a scan mode and, when the clock to the corresponding flipflops is disabled, to set the D input of the flipflops to a constant logic level, for example, by routing the scan-enable input to the D-input of the flipflop.

Figure 4:
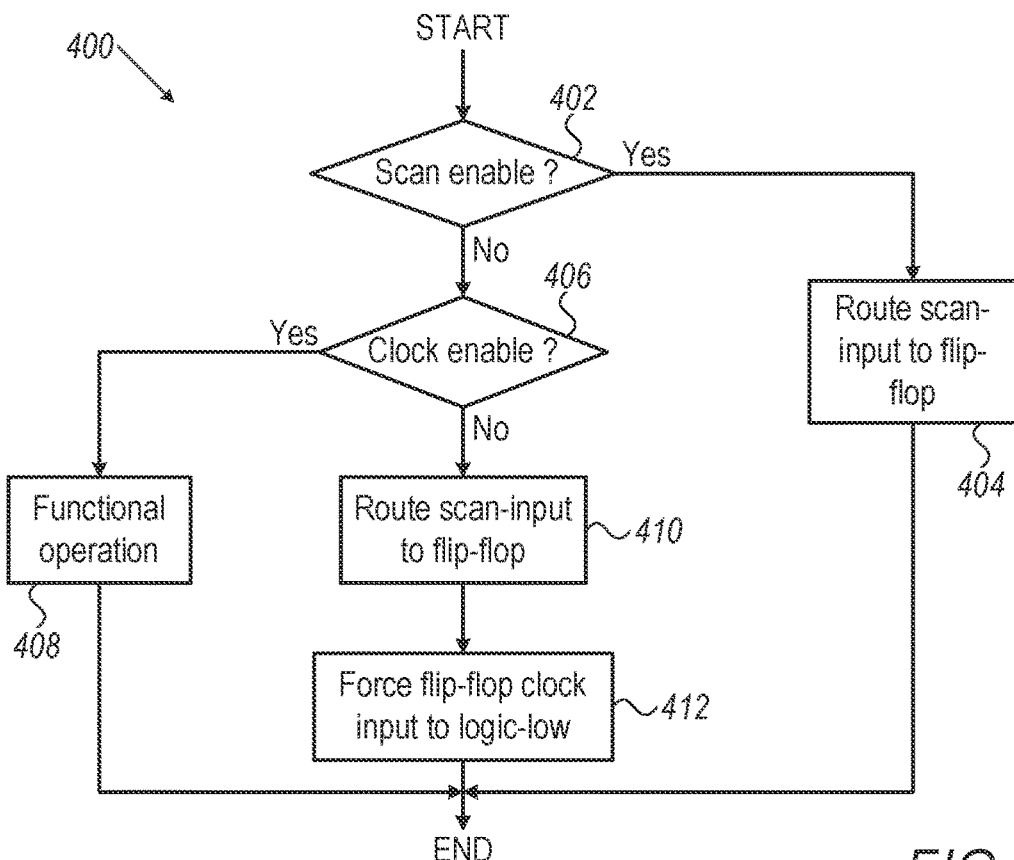
FIG. 4 is a flowchart that schematically illustrates a method for power consumption reduction using data gating, in accordance with an embodiment that is described herein.

FIG. 4 is a flowchart that schematically illustrates a method 400 for power consumption reduction using data gating, in accordance with an embodiment that is described herein. The flowchart is executed by clock gates 110 and scan circuits 106 (FIG. 1). Each of the scan circuits and the clock gates executes the flow independently of the other scan circuits and clock gates.

The flowchart starts at a Check-Scan-Enable stage 402, wherein the scan circuit checks if scan-enable is indicated. If so, the flowchart enters a Route-Scan-to-flipflop stage 404, wherein the scan circuit routes the scan-in input to the D-input of DFF 102, scan-test of the DFFs is entered and the flowchart ends.

If, in stage 402, there is no scan-enable indication, the clock-gate and the scan-circuit enter a Check-Clock-Enable stage 406, and check if the clock of the corresponding DFF is enabled. If so, the clock gate and the scan circuit enter a Functional-Operation stage 408, wherein the scan-mode is disabled, and the clock is not gated, and then the flowchart ends.

If, in stage 406, the clock is not enabled, the scan circuit will, in a route-scan-input-to-flipflop stage 410, route the Scan input, (which is set low in functional mode) to the D input of DFF 102, so that the primary latch of the DFF will not toggle. Next, in a force-flipflop-clock-low, clock gate 110 will set the clock input of the flipflop to low, preventing the secondary latch from toggling.

Thus, according to the method illustrated in FIG. 4 and described hereinabove, a clock gate and a scan circuit are operable to, responsive to a scan mode indication (scan enable high)—route the scan-in input to the D input of the corresponding flipflop; and, responsive to a clock-disable indication (clock-enable at low), i) force a constant low level at the clock input of the flipflop, to prevent the secondary latch from toggling, and, ii) route the scan enable input, which is low in functional mode, to the D input of the flipflop, to prevent the primary latch from toggling.

Figure 5:
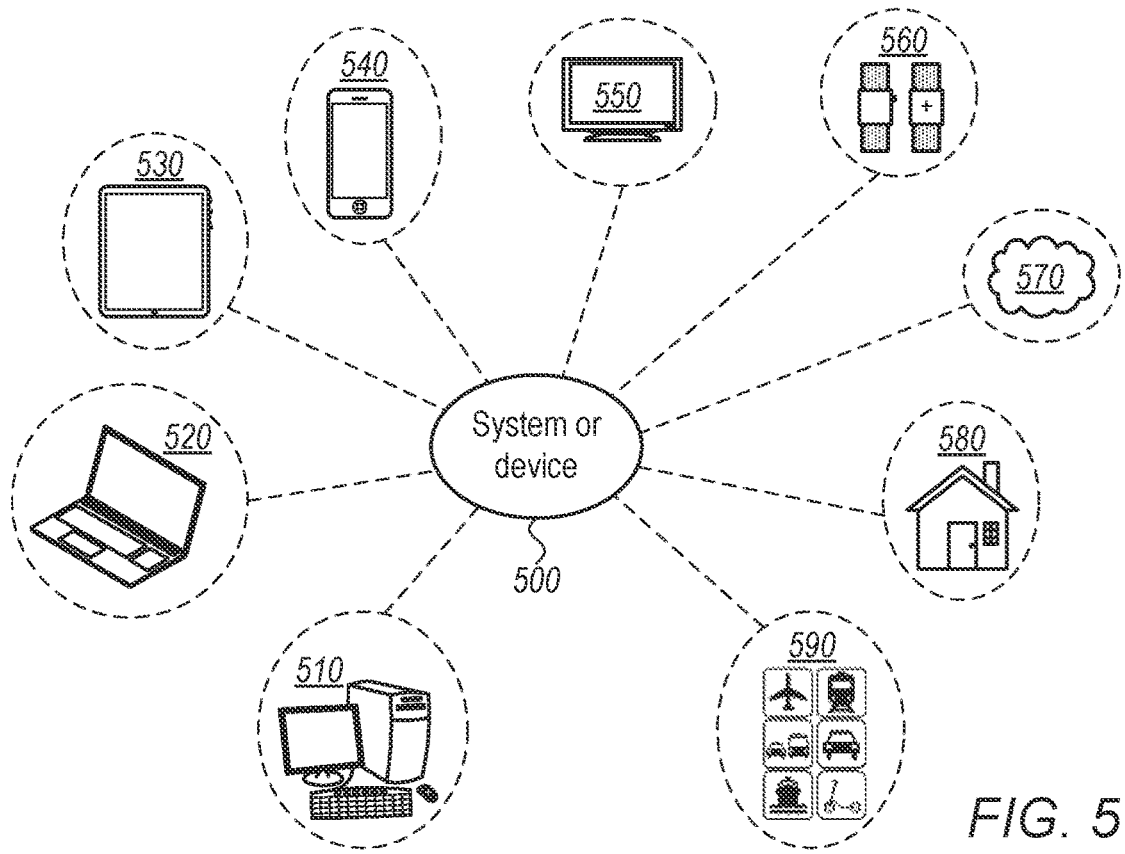
FIG. 5 is a diagram that schematically illustrates various types of systems that may include any of the circuits, devices, or system discussed herein, in accordance with embodiments that are described herein.

FIG. 5 is a diagram 500 that schematically illustrates various types of systems that may include any of the circuits, devices, or system discussed above, in accordance with embodiments described herein. System or device 500, which may incorporate or otherwise utilize one or more of the techniques described herein, may be utilized in a wide range of areas. For example, system or device 500 may be utilized as part of the hardware of systems such as a desktop computer 510, laptop computer 520, tablet computer 530, cellular or mobile phone 540, or television 550 (or set-top box coupled to a television).

Similarly, disclosed elements may be utilized in a wearable device 560, such as a smartwatch or a health-monitoring device. Smartwatches, in many embodiments, may implement a variety of different functions, for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 500 may also be used in various other contexts. For example, system or device 500 may be utilized in the context of a server computer system, such as a dedicated server or on shared hardware that implements a cloud-based service 570. Still further, system or device 500 may be implemented in a wide range of specialized everyday devices, including devices 580 commonly found in the home such as refrigerators, thermostats, security cameras, etc. The interconnection of such devices is often referred to as the "Internet of Things" (IoT). Elements may also be implemented in various modes of transportation. For example, system or device 500 could be employed in the control systems, guidance systems, entertainment systems, etc. of various types of vehicles 590.

The applications illustrated in FIG. 5 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 6:
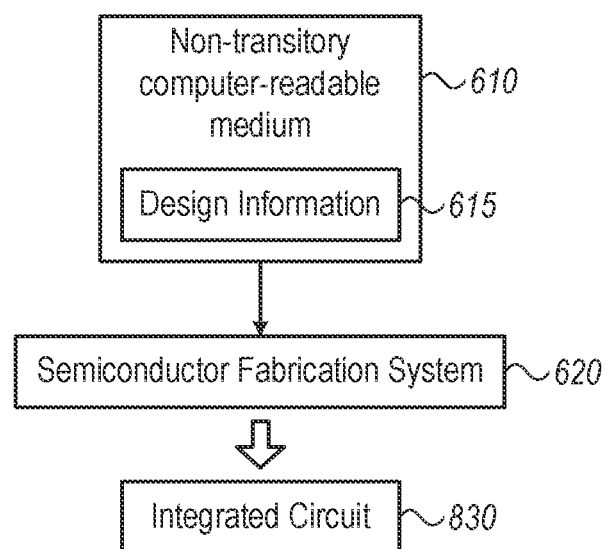
FIG. 6 is a block diagram illustrating an example non-transitory computer-readable storage medium that stores circuit design information, according to some embodiments.

FIG. 6 is a block diagram illustrating an example non-transitory computer-readable storage medium that stores circuit design information, according to some embodiments. In the illustrated embodiment semiconductor fabrication system 620 is configured to process the design information 615 stored on non-transitory computer-readable medium 610 and fabricate integrated circuit 830 based on the design information 615.

Non-transitory computer-readable storage medium 610, may include any of various appropriate types of memory devices or storage devices. Non-transitory computer-readable storage medium 610 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 610 may include other types of non-transitory memory as well or combinations thereof. Non-transitory computer-readable storage medium 810 may include two or more memory mediums which may reside in different locations, e.g., in different computer systems that are connected over a network.

Design information 615 may be specified using any of various appropriate computer languages, including hardware description languages such as, without limitation: VHDL, Verilog, SystemC, SystemVerilog, RHDL, M, MyHDL, etc. Design information 615 may be usable by semiconductor fabrication system 620 to fabricate at least a portion of integrated circuit 630. The format of design information 815 may be recognized by at least one semiconductor fabrication system 620. In some embodiments, design information 615 may also include one or more cell libraries which specify the synthesis, layout, or both of integrated circuit 630. In some embodiments, the design information is specified in whole or in part in the form of a netlist that specifies cell library elements and their connectivity. Design information 615, taken alone, may or may not include sufficient information for fabrication of a corresponding integrated circuit. For example, design information 815 may specify the circuit elements to be fabricated but not their physical layout. In this case, design information 815 may need to be combined with layout information to actually fabricate the specified circuitry.

Integrated circuit 630 may, in various embodiments, include one or more custom macrocells, such as memories, analog or mixed-signal circuits, and the like. In such cases, design information 615 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 620 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 820 may also be configured to perform various testing of fabricated circuits for correct operation.

In various embodiments, integrated circuit 630 is configured to operate according to a circuit design specified by design information 615, which may include performing any of the functionality described herein. For example, integrated circuit 630 may include any of various elements shown in FIGS. 1, 2, 3, and 5. Further, integrated circuit 630 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, well as such alternatives, modifications, and as equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112 (f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

The invention claimed is:

1. An Integrated Circuit (IC), comprising:
a storage element having an input and an output; and
control circuitry, configured to:
receive a clock-enable control; and
while the clock-enable control indicates that the output of the storage element is to be disabled from toggling, prevent an input of the storage element from toggling, without adding latency to a functional-data input of the storage element, by setting the input to a constant logic state.

2. The IC according to claim 1, wherein:
the storage element is a dual-latch Flip-Flop (FF) comprising a primary latch and a secondary latch,
in gating a clock signal provided to the storage element, the control circuit is configured to set the primary latch to a transparent mode, and
to prevent the input of the storage element from toggling, the control circuit is configured to set the input of the primary latch to the constant logic state.

3. The IC according to claim 1, wherein the storage element comprises one or more latches, and wherein, in setting the input to the constant logic state, the control circuitry is configured to prevent any of the latches from toggling while the output is disabled from toggling, regardless of whether or not the functional-data input of the storage element is toggling.

4. The IC according to claim 1, wherein, to set the input to the constant logic state, the control circuitry comprises a logic gate configured to set the storage element to a scan mode in response to the clock-enable control disabling a clock signal provided to the storage element.

5. The IC according to claim 1, wherein the control circuitry comprises a logic gate, which is configured to set the input of the storage element to the constant logic state in response to the clock-enable control disabling a clock signal provided to the storage element.

6. A method in an Integrated Circuit (IC) that includes at least a storage element having an input and an output, the method comprising:
receiving a clock-enable control; and while the clock-enable control indicates that the output of the storage element is to be disabled from toggling, preventing an input of the storage element from toggling, without adding latency to a functional-data input of the storage elements, by setting the input to a constant logic state.

7. The method according to claim 6, wherein:
the storage element is a dual-latch Flip-Flop (FF) comprising a primary latch and a secondary latch,
gating a clock signal provided to the storage element comprises setting the primary latch to a transparent mode, and
preventing an input of the storage element from toggling comprises setting the input of the primary latch to the constant logic state.

8. The method according to claim 6, wherein the storage element comprises one or more latches, and wherein setting the input to the constant logic state comprises preventing any of the latches from toggling while the output is disabled from toggling, regardless of whether or not the functional-data input of the storage element is toggling.

9. The method according to claim 6, wherein setting the input of the storage element to the constant logic state comprises setting the storage element to a scan mode using a logic gate, in response to the clock-enable control disabling a clock signal provided to the storage element.

10. The method according to claim 6, wherein setting the input of the storage element to the constant logic state is performed using a logic gate, in response to the clock-enable control disabling a clock signal provided to the storage element.

11. An apparatus comprising a processor that comprises (i) fetch circuitry configured to fetch instructions and (ii) execute circuitry configured to execute instructions, wherein one or both of the fetch circuitry and the execute circuitry comprise:
a storage element having an input and an output; and
control circuitry, configured to:
receive a clock-enable control; and
while the clock-enable control indicates that the output of the storage element is to be disabled from toggling, prevent an input of the storage element from toggling, without adding latency to a functional-data input of the storage element, by setting the input to a constant logic state.

12. The apparatus according to claim 11, further comprising a display device and one or more input devices.

13. The apparatus according to claim 11, wherein:
the storage element is a dual-latch Flip-Flop (FF) comprising a primary latch and a secondary latch,
in gating a clock signal provided to the storage element, the control circuit is configured to set the primary latch to a transparent mode, and
to prevent the input of the storage element from toggling, the control circuit is configured to set the input of the primary latch to the constant logic state.

14. The apparatus according to claim 11, wherein the storage element comprises one or more latches, and wherein, in setting the input to the constant logic state, the control circuitry is configured to prevent any of the latches from toggling while the output is disabled from toggling, regardless of whether or not the functional-data input is toggling.

15. The apparatus according to claim 11, wherein, to set the input to the constant logic state, the control circuitry comprises a logic gate configured to set the storage element to a scan mode in response to the clock-enable control disabling a clock signal provided to the storage element.

16. The apparatus according to claim 11, wherein the control circuitry comprises a logic gate, which is configured to set the input of the storage element to the constant logic state in response to the clock-enable control disabling a clock signal provided to the storage element.

* * * * *